(12) United States Patent
Patzer et al.

(10) Patent No.: US 8,906,794 B1
(45) Date of Patent: Dec. 9, 2014

(54) GATE SILICIDATION

(71) Applicant: GLOBALFOUNDRIES Inc., Grand Cayman (KY)

(72) Inventors: Joachim Patzer, Langebrueck (DE); Ardechir Pakfar, Dresden (DE); Clemens Fitz, Dresden (DE); Dominic Thurmer, Dresden (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 0 days.

(21) Appl. No.: 13/956,844

(22) Filed: Aug. 1, 2013

(51) Int. Cl.
  *H01L 21/00* (2006.01)
  *H01L 27/088* (2006.01)
  *H01L 21/28* (2006.01)

(52) U.S. Cl.
  CPC ........ *H01L 27/088* (2013.01); *H01L 21/28097* (2013.01)
  USPC .......................................... 438/586; 438/620

(58) Field of Classification Search
  CPC ............ H01L 21/762; H01L 21/76897; H01L 21/28097
  USPC .................................................. 438/586, 620
  See application file for complete search history.

(56) References Cited

U.S. PATENT DOCUMENTS 8,728,900 B2 * 5/2014 Chuang et al. ................ 438/382

\* cited by examiner

*Primary Examiner* — Tran Tran
(74) *Attorney, Agent, or Firm* — Amerson Law Firm, PLLC (57) ABSTRACT

A method for performing silicidation of gate electrodes includes providing a semiconductor device having first and second transistors with first and second gate electrodes formed on a semiconductor substrate, forming an oxide layer on the first and second gate electrodes and the semiconductor substrate, forming a cover layer on the oxide layer, and back etching the cover layer to expose portions of the oxide layer above the first and second gate electrodes while maintaining a portion of the cover layer between the first and second gate electrodes. Furthermore, the exposed portions of the oxide layer are removed from the first and second gate electrodes to expose upper portions of the first and second gate electrodes, while maintaining a portion of the oxide layer between the first and second gate electrodes, and a silicidation of the exposed upper portions of the first and second gate electrodes is performed.

11 Claims, 9 Drawing Sheets

GATE SILICIDATION

BACKGROUND OF THE INVENTION

1. Field of the Invention

Generally, the present disclosure relates to the field of integrated circuits and semiconductor devices, and, more particularly, to the silicidation of gate electrodes of transistor devices.

2. Description of the Related Art

The fabrication of advanced integrated circuits, such as CPUs, storage devices, ASICs (application specific integrated circuits) and the like, requires the formation of a large number of circuit elements on a given chip area according to a specified circuit layout. In a wide variety of electronic circuits, field effect transistors represent one important type of circuit element that substantially determines performance of the integrated circuits. Generally, a plurality of process technologies are currently practiced for forming field effect transistors, wherein, for many types of complex circuitry, MOS technology is currently one of the most promising approaches due to the superior characteristics in view of operating speed and/or power consumption and/or cost efficiency. During the fabrication of complex integrated circuits using, for instance, MOS technology, millions of transistors, e.g., N-channel transistors and/or P-channel transistors, are formed on a substrate including a crystalline semiconductor layer.

A field effect transistor, irrespective of whether an N-channel transistor or a P-channel transistor is considered, typically comprises so-called PN junctions that are formed by an interface of highly doped regions, referred to as drain and source regions, with a slightly doped or non-doped region, such as a channel region, disposed between the highly doped regions. In a field effect transistor, the conductivity of the channel region, i.e., the drive current capability of the conductive channel, is controlled by a gate electrode formed adjacent to the channel region and separated therefrom by a thin insulating layer. The conductivity of the channel region, upon formation of a conductive channel due to the application of an appropriate control voltage to the gate electrode, depends on, among other things, the dopant concentration, the mobility of the charge carriers and, for a given extension of the channel region in the transistor width direction, the distance between the source and drain regions, which is also referred to as channel length. Hence, in combination with the capability of rapidly creating a conductive channel below the insulating layer upon application of the control voltage to the gate electrode, the conductivity of the channel region substantially affects the performance of MOS transistors. Thus, as the speed of creating the channel, which depends on the conductivity of the gate electrode, and the channel resistivity substantially determine the transistor characteristics, the scaling of the channel length is a dominant design criterion for accomplishing an increase in the operating speed of the integrated circuits.

In sophisticated transistor elements, a plurality of features finally determine the overall performance of the transistor, wherein a complex mutual interaction of these factors may be difficult to assess so that a wide variety of performance variations may be observed for a given basic transistor configuration. For example, the conductivity of doped silicon-based semiconductor regions may be increased by providing a metal silicide therein in order to reduce overall sheet resistance and contact resistivity. For example, the drain and source regions may receive a metal silicide, such as nickel silicide, nickel platinum silicide and the like, thereby reducing the overall series resistance of the conductive path between the drain and source terminals and the intermediate channel region.

Similarly, a metal silicide may typically be formed in the gate electrode, which may comprise polysilicon material, thereby enhancing conductivity and thus reducing signal propagation delay. Although an increased amount of metal silicide in the gate electrode may per se be desirable in view of reducing the overall resistance thereof, a substantially complete silicidation of the polycrystalline silicon material down to the gate dielectric material may not be desirable in view of threshold voltage adjustment of the corresponding transistor element. It may, therefore, be desirable to maintain a certain portion of the doped polysilicon material in direct contact with the gate dielectric material so as to provide well-defined electronic characteristics in the channel region, so as to avoid significant threshold variations, which may be caused by a substantially full silicidation within portions of the gate electrode.

Conventionally, both the gate electrodes of thin film transistors and the silicon substrate adjacent to the gate electrodes (particularly, source and drain regions) are concurrently subject to silicidation. If, on the other hand, it is preferred to keep particular regions of the silicon substrate free of any metal silicide, appropriately shaped mask layers have to be formed previous to the silicidation process. Consequently, if silicidation of gate electrodes only is desired, the overall processing is complicated.

In view of the situation described above, the present disclosure provides techniques that allow for the silicidation of gate electrodes only without forming metal silicides in the neighborhoods of the gate electrodes of thin film transistors. The disclosure moreover provides a semiconductor device without silicidation in a substrate whereupon gate electrodes of transistors are formed that comprise metal silicide regions.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

An illustrative method for performing silicidation of gate electrodes includes providing a semiconductor device having a first transistor with a first gate electrode formed on a semiconductor substrate and a second transistor with a second gate electrode formed on the semiconductor substrate, forming an oxide layer on the first and second gate electrodes and the semiconductor substrate, forming a cover layer on the oxide layer, and back etching the cover layer to expose portions of the oxide layer above the first and second gate electrodes while maintaining a portion of the cover layer between the first and second gate electrodes. Furthermore, the exposed portions of the oxide layer are removed from the first and second gate electrodes to expose upper portions of the first and second gate electrodes, while maintaining a portion of the oxide layer between the first and second gate electrodes, and a silicidation of the exposed upper portions of the first and second gate electrodes is performed.

Another illustrative method for performing silicidation of gate electrodes of transistor devices includes providing a semiconductor device having a semiconductor substrate with a defined active device area, a logic or SRAM area and a passive device area, wherein the active device area includes two transistors each comprising a gate electrode, forming an oxide layer on the active device area, the logic or SRAM area covering the transistors and the passive device area, forming a mask layer on the oxide layer, patterning the mask layer to obtain a mask covering the active device area and the passive device area and exposing portions of the oxide layer on the transistors and on the semiconductor substrate in the logic or SRAM area, based on the mask forming a cover layer on the exposed portions of the oxide layer on the transistors and on the semiconductor substrate in the logic or SRAM area, back etching the cover layer to expose portions of the oxide layer above the gate electrodes while maintaining a portion of the cover layer between the first and second gate electrodes, removing the exposed portions of the oxide layer from the gate electrodes to expose upper portions of the gate electrodes while maintaining a portion of the oxide layer between the gate electrodes, and performing silicidation of the exposed upper portions of the first and second gate electrodes.

According to another example, a method for performing silicidation of gate electrodes includes providing a semiconductor device having a semiconductor substrate with a defined active device area, a logic or SRAM area and a passive device area, wherein the active device area comprises two transistors each comprising a gate electrode, forming an oxide layer on the active device area, the logic or SRAM area and the passive device area, wherein the oxide layer covers the gate electrodes and the semiconductor substrate in the logic or SRAM area, forming a mask layer on the oxide layer, the mask layer comprising a photoresist, an anti-reflective coating and an optical planarizing layer, defining a pattern in the photoresist and exposing the patterned photoresist, wherein the pattern comprises an opening above the logic or SRAM area, and etching the anti-reflective coating based on the exposed patterned photoresist, etching the optical planarizing layer based on the etched anti-reflective coating such that portions of the oxide layer above the gate electrodes are exposed while maintaining a portion of the optical planarizing layer between the gate electrodes, removing the exposed portions of the oxide layer from the gate electrodes to expose upper portions of the gate electrodes while maintaining a portion of the oxide layer between the gate electrodes, and performing silicidation of the exposed upper portions of the gate electrodes.

Furthermore, a semiconductor device is provided including a semiconductor substrate and at least two transistors adjacent to each other, each transistor comprising a gate electrode having a metal silicide at an upper region, i.e., not in contact with a gate dielectric formed on the substrate, and wherein the semiconductor substrate is free of any silicidation, i.e., it particularly does not include a metal silicide.

Further, a semiconductor device is provided including a semiconductor substrate with a defined active device area, a logic or SRAM area and a passive device area, wherein the active device area includes two transistors, each comprising a gate electrode having a metal silicide at an upper region thereof, and wherein the semiconductor substrate is free of any silicidation at least in the logic or SRAM area.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present disclosure will now be described with reference to the attached figures. Various structures, systems and devices are schematically depicted in the drawings for purposes of explanation only and so as to not obscure the present disclosure with details which are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary or customary meaning as understood by those skilled in the art, is intended to be implied by consistent usage of the term or phrase herein. To the extent that a term or phrase is intended to have a special meaning, i.e., a meaning other than that understood by skilled artisans, such a special definition shall be expressively set forth in the specification in a definitional manner that directly and unequivocally provides the special definition for the term or phrase.

The present disclosure provides a method for performing silicidation of gate electrodes of transistors. In the art, silicidation of gate electrodes cannot be performed without silicidation of the adjacent semiconductor substrate, or such a selective silicidation restricted to gate electrodes would cause the need for complicated mask patterning. In the herein disclosed methods, a mask is provided based on that a cover layer covering an oxide layer formed on the gate electrodes and the semiconductor substrate may be formed. The cover layer is etched back to expose portions of the oxide layer on the gate electrodes. These portions can be subsequently removed and silicidation of the exposed upper portions of the gate electrodes only may be achieved. By this sequence of processing steps, silicidation of the gate electrodes without forming metal silicide in the semiconductor substrate may be readily achieved without the need for a time-consuming complicated procedure.

Figure 1A:
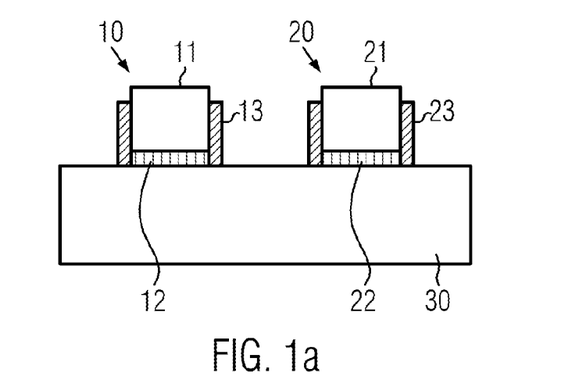
FIGS. 1a-1h illustrate manufacturing stages of a method for performing silicidation of gate electrodes according to an illustrative embodiment.

An exemplary starting point for the provided method for silicidation of gate electrodes is illustrated in FIG. 1a. Two transistor devices 10 and 20 are formed atop of a semiconductor substrate 30. The two transistor devices 10 and 20 may be designed as N-channel or P-channel transistors—both or one of them may be designed as a P-channel transistor, whereas the other one is designed as an N-channel transistor. The channel regions are doped according to the selected conductivity type of the transistors.

The semiconductor substrate 30 may comprise a semiconductor layer, which in turn may be comprised of any appropriate semiconductor material, such as silicon, silicon/germanium, silicon/carbon, other II-VI or III-V semiconductor compounds and the like. The semiconductor layer may comprise a significant amount of silicon due to the fact that semiconductor devices of high integration density may be formed in volume production on the basis of silicon due to the enhanced availability and the well-established process techniques developed over the last decades. However, any other appropriate semiconductor materials may be used, for instance, a silicon-based material containing other iso-electronic components, such as germanium, carbon and the like. Furthermore, the substrate 30 and the semiconductor layer may define an SOI (silicon-on-insulator) configuration. The semiconductor substrate 30 may be a silicon substrate, in particular, a single crystal silicon substrate. Other materials may be used to form the semiconductor substrate 30 as, for example, germanium, silicon/germanium, gallium phosphate, gallium arsenide, etc.

In the manufacturing stage shown in FIG. 1a, each of the transistors 10 and 20 may comprise a gate electrode 11 and 21 formed on a corresponding gate insulation layer 12 and 22 (gate dielectrics), respectively, which separates the gate electrodes 11 and 21 from channel regions defined in the semiconductor layer of the semiconductor substrate 30. The channel lengths may be below 50 nm, for example. The gate dielectrics may be provided in the form of a silicon oxide-based material, such as a silicon oxynitride and the like, followed by a high-k dielectric material, such as hafnium oxide, hafnium silicon oxide and the like. Moreover, spacer structures 13 and 23 may be formed on sidewalls of the gate electrodes 11 and 21. The spacer structures 13 and 23 in this manufacturing stage may comprise a plurality of individual spacer elements as required for the definition of the vertical and lateral dopant profile in respective drain and source regions formed in the semiconductor layer of the semiconductor substrate 30. Alternatively, one or more of the individual spacer elements of the structures 13 and 23 may have been removed after the formation of the respective drain and source regions, when the corresponding spacer elements are considered inappropriate for the further processing.

Formation of the source and drain regions includes ion implantation and annealing. After one or more of the implantation processes performed to define the deep drain and source portions and possibly extension regions, a laser anneal process may be performed to activate dopants and also re-crystallize implantation-induced damage. An appropriate laser source may provide a continuous or a pulsed laser beam, which may be directed onto a specific device portion by means of an appropriate beam shaping system as the above-described optics. That is, depending on the output power of the laser source, the optics may provide a desired specific beam shape and thus size of a corresponding device portion and the energy density supplied thereto. An appropriate relative movement between the corresponding radiation beam and the substrate 30 is caused, wherein the corresponding scan speed may be selected so that a desired total exposure time during the anneal process is obtained for each exposed device area. Since dopant diffusion may not be desirable during the laser-based anneal process, the corresponding scan speed is typically selected such that an effective exposure to the radiation beam is restricted to extremely short time intervals in the range of 0.1 seconds and significantly less, such as 10 milliseconds, or even microseconds and less. On the other hand, the local temperature in the surface-near area of the substrate 30 may depend on the energy density, which is selected moderately high so as to obtain a high degree of dopant activation while not significantly contributing to dopant diffusion.

The gate electrode structures 11 and 21 may comprise polysilicon. In principle, the gate electrode structures 11 and 21 may comprise a plurality of cap layers (made, for example, of such as a titanium nitride layer) and diffusion layers which may comprise an appropriate metal species, such as aluminum, followed by a further cap layer, for example a titanium nitride layer. Additionally, a further diffusion layer, such as a lanthanum layer, may be provided in combination with a titanium nitride cap layer. The gate electrode structures 11 and 21 may comprise an amorphous or polycrystalline silicon material, depending on the overall process strategy. Similarly, the gate electrode structures 11 and 21 may comprise the gate dielectric materials 12 and 22, respectively, followed by a diffusion layer, for example a lanthanum layer, in combination with a titanium nitride layer followed by a silicon layer. Consequently, due to the plurality of cap layers and diffusion layers, the gate electrode structures 11 and 21 may have a very different configuration caused by the preceding manufacturing processes. Typically, the gate dielectrics 12 and 22 are provided by oxidation and deposition techniques in combination with any other appropriate surface treatments and the like. The gates can represent polycontrol gates.

Figure 1B:
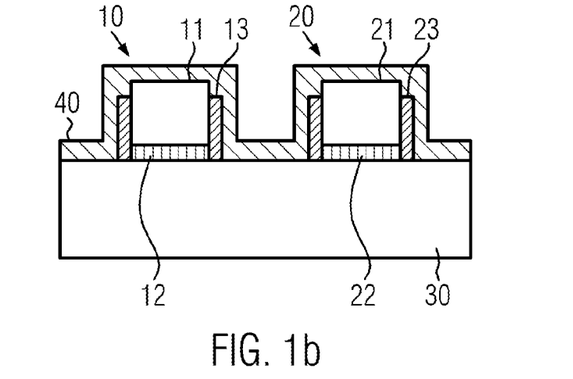

FIG. 1b shows a further developed manufacturing stage wherein an oxide liner 40 is formed atop of the configuration shown in FIG. 1a. For example, the oxide may be formed by deposition and may comprise silicon oxide. The oxide liner 40 will serve as a sacrificial stop layer in the further processing described below. The oxide liner may have a thickness of 50-100 nm, in particular, 80 nm, and may be deposited by a conformal oxide deposition process.

Figure 1C:
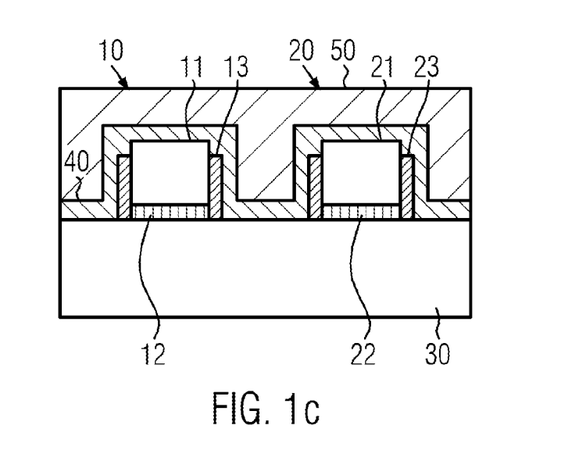

In the next processing step, illustrated in FIG. 1c, a cover layer 50, for example an organic layer, is formed on the oxide liner 40. The cover layer 50 may consist of or comprise an optical planarizing layer (OPL) formed (for example, deposited) at a predetermined thickness for providing reflectivity and topography control, for example, during the etching of the underlying oxide layer 40. The OPL may comprise spin-on-carbon. The OPL may have a thickness of 100-300 nm, in particular, 200 nm. Some particular examples of OPLs are ODL (available from Shin-etsu) and a top coating composition known as NFC (available from Japan Synthetic Rubber), as well as JSR MICRO HM8006.

Figure 1D:
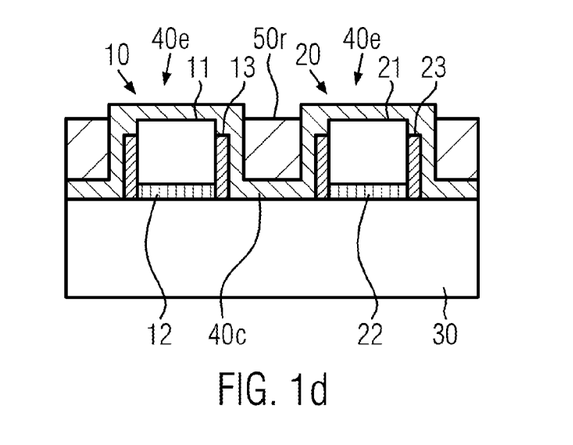

The cover layer 50 is subsequently etched back to expose the sacrificial oxide layer 40 formed atop of the gate electrodes 11 and 21, as shown in FIG. 1d. $Ar/O_2$ chemistry may be used for back etching a cover layer 50 provided in the form of an OPL. Both atop of transistor device 10 and transistor device 20, exposed portions 40e of the oxide layer 40 may be identified. In this processing step, it is essential that a portion 50r of the cover layer 50 remains between the gate electrodes 11 and 21 such that the portion 40c of the oxide layer 40 on the substrate between the gate electrodes 11 and 21 is still covered. The exposed portions 40e may, for example, have heights of between 1/10 to 1/2, particularly, 1/5 to 1/3 of the heights of the gate electrodes.

Figure 1E:
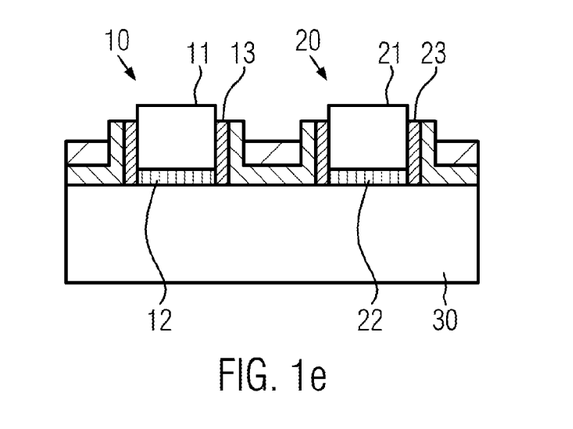

In the next processing step, as shown in FIG. 1e, the etching chemistry is changed to open the sacrificial oxide layer 40, i.e., the exposed portions 40e of the oxide layer 40 are etched away from the upper surfaces of the gate electrodes 11 and 21 and spacers 13 and 23. CHF$_3$/He chemistry may be used for etching the sacrificial oxide layer 40.

Figure 1F:
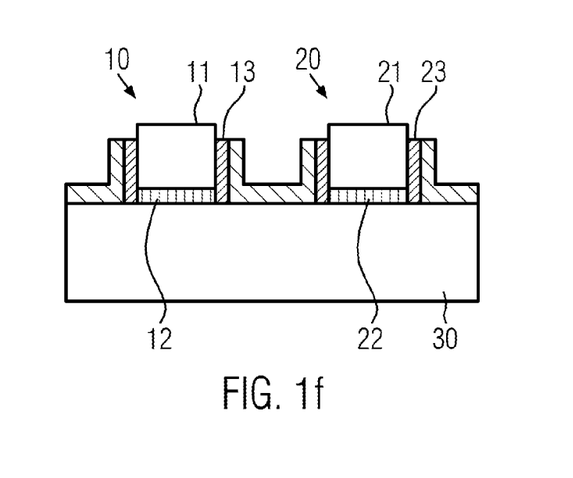

FIG. 1f shows the manufacturing stage after removal of the remaining cover layer 50r and completion of an NiSi preclean step that might be performed with dHF and/or SiCoNi. Of course, the initial thickness of the sacrificial oxide layer formed in the manufacturing step illustrated in FIG. 1b has to be chosen such that sufficient oxide is still present after NiSi precleaning in order to block subsequent silicidation of the semiconductor substrate 30 shown in FIG. 1g. Metal silicide regions 60 in the upper portions of the gate electrodes 11 and 21 may be formed, for instance, by depositing an appropriate refractory metal and initiating a silicidation process on the basis of an appropriate heat treatment. The metal silicide regions 60 may be formed on the basis of refractory metals, such as nickel, platinum and the like, that may be deposited and may be converted into a metal silicide by performing an appropriate heat treatment, for example, in the form of a rapid thermal anneal.

Figure 1G:
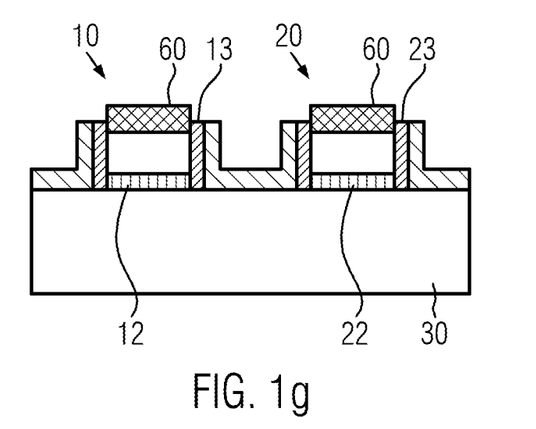

Thereafter, any non-reacted metal material may be removed on the basis of well-established selective etch techniques, wherein additional heat treatments for stabilizing the overall characteristics may follow, if required. During the silicidation process, the spacer structures 13 and 23 may reliably cover the sidewalls of the gate electrodes 11 and 21, thereby avoiding significant metal "wraparound" so that enhanced controllability and uniformity of the silicidation process may be accomplished. Consequently, a desired thickness of the metal silicide regions 60 in the upper portions of the gate electrodes 11 and 21 may be obtained in a highly controllable manner.

Figure 1H:
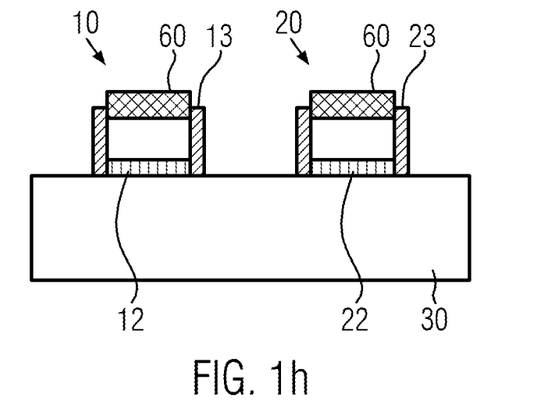

After completion of the final anneal process, the remaining sacrificial oxide 40 is removed and the configuration illustrated in FIG. 1h is achieved. Silicidation of the gate electrodes 11 and 21 of transistor devices 10 and 20 is obtained without any silicidation of the semiconductor substrate 30 whereupon the gate electrodes 11 and 21 are formed in accordance with an aspect of this inventive embodiment.

Figure 2A:
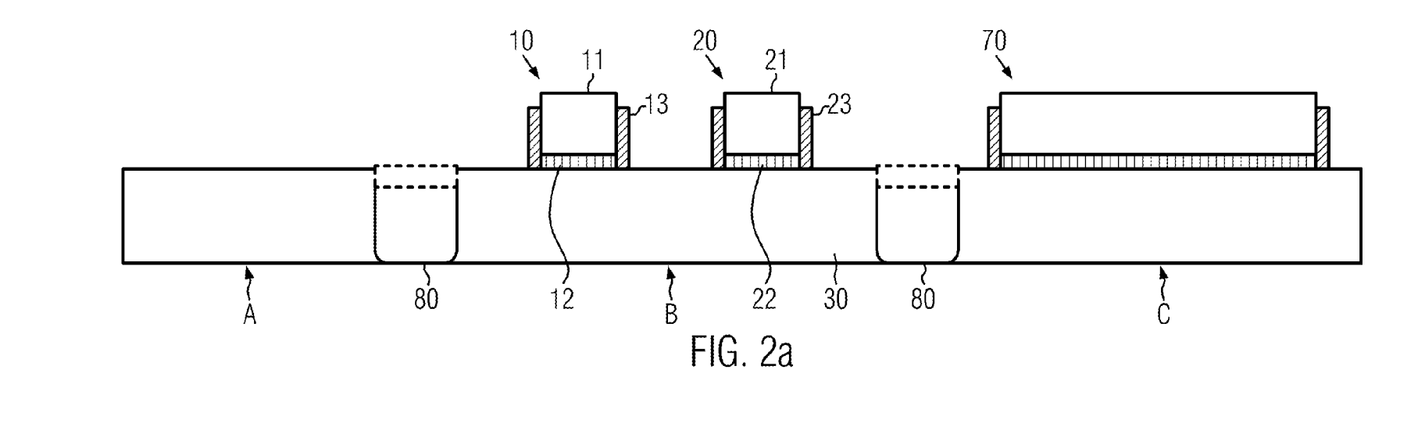
FIGS. 2a-2i illustrate manufacturing stages of a method for performing silicidation of gate electrodes according to another illustrative embodiment.

Another embodiment will now be described with reference to FIGS. 2a-2i. In FIG. 2a, a manufacturing stage of a semiconductor device comprising three different areas, namely an active device area A, a logic/SRAM area B and a passive device area C, is illustrated. The active device area A may comprise a processor. The passive device area C may comprise a resistor 70 or one or more resistors and/or capacitors, etc. The different areas A, B and C are separated from each other by insulating regions 80, for example, (shallow) trench isolations. In the logic/SRAM area B, two exemplary transistors 10 and 20 are shown. Accordingly, the logic/SRAM area B may comprise implanted areas which may conveniently be referred to as drain/source regions with respective extension regions. Typical critical dimensions may generally be in the range of 45 nm or below. In particular, the channel lengths may be below 50 nm, for example.

As described in the context of the embodiment shown in FIG. 1a, each of the transistors 10 and 20 may comprise a gate electrode 11 and 21 formed on corresponding gate insulation layers 12 and 22 (gate dielectrics), respectively, which separate the gate electrodes 11 and 21 from channel regions defined in the semiconductor layer of the semiconductor substrate 30. The gate dielectrics may be provided in the form of a silicon oxide-based material, such as a silicon oxynitride and the like, followed by a high-k dielectric material, such as hafnium oxide, hafnium silicon oxide and the like. Moreover, spacer structures 13 and 23 may be formed on sidewalls of the gate electrodes 11 and 21. The gate electrode structures 11 and 21 may be formed as described above with reference to FIG. 1a.

In the logic/SRAM area B, the semiconductor material may comprise a specific lateral and vertical dopant concentration distribution as is required for the formation of transistor elements so as to define drain and source regions therein. For example, in active semiconductor regions of the logic/SRAM area B designed to form N-channel transistors therein, highly doped portions comprise an N-type dopant, while the remaining semiconductor material, i.e., the body region, may comprise a significantly reduced concentration of a P-type dopant material. That is, a semiconductor substrate, such as a silicon substrate, may be provided with a basic P-dopant concentration so that the body region of a respective active semiconductor region may correspond to a portion of the pre-doped substrate. On the other hand, if an active semiconductor region would be provided within the P-doped substrate so as to enable the formation of P-channel transistors, a specific area of the substrate may be doped with an N-channel type dopant so as to create a well region having an overall N-type conductivity. In this well region, a highly doped P-conductivity may locally be provided while the remaining part of the well region may thus act as the body region of the active semiconductor region of the logic/SRAM area B. It should be appreciated that other doping regimes may be used, such as an N-doped substrate and the like.

The semiconductor substrate 30 may be made of the same material in all three areas A, B and C. For example, a silicon-based material containing other iso-electronic components, such as germanium, carbon and the like, may be used. Furthermore, the substrate 30 and the semiconductor layer may define an SOI configuration with a buried oxide layer included. The semiconductor substrate 30 may be a silicon substrate, in particular, a single crystal silicon substrate. Other materials may be used to form the semiconductor substrate 30, such as, for example, germanium, silicon/germanium, gallium phosphate, gallium arsenide, etc.

Figure 2B:
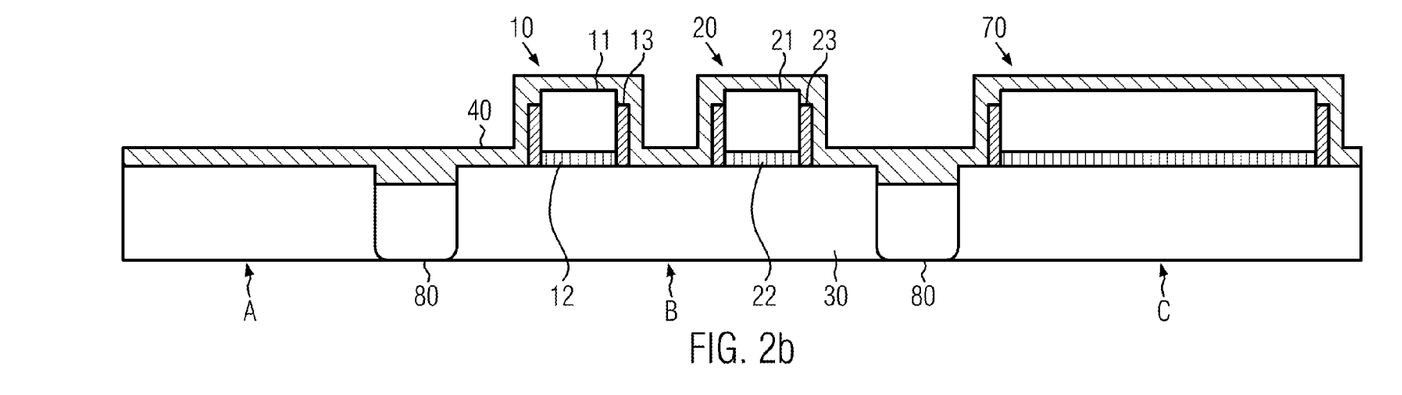
Figure 2C:
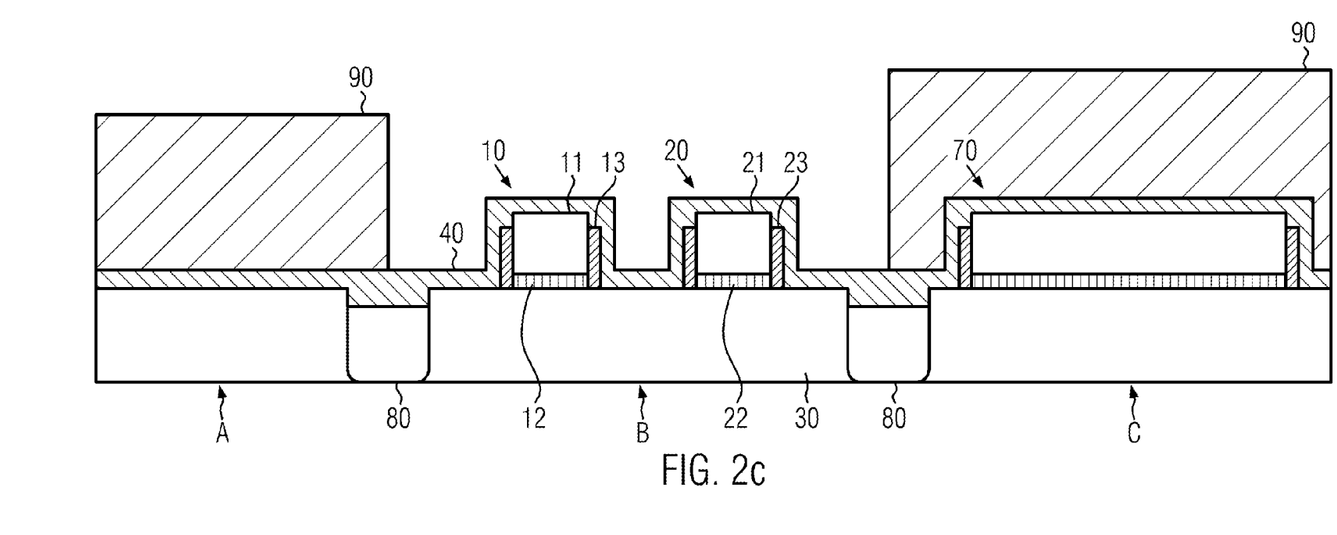

In the manufacturing stage shown in FIG. 2b, a sacrificial oxide layer 40 is formed above all three areas A, B and C. Particularly, the oxide layer 40 covers the gate electrodes 11 and 21 and spacers 13 and 23 as well as the substrate 30 in the logic/SRAM area B, isolation trenches 80 and the resistor 70 as well as the substrate 30 in the passive device area C.

In this example, silicidation is only desired for the gate electrodes 11 and 21 of the transistors 10 and 20 of the logic/SRAM area B. Therefore, a mask 90 is provided on regions where no silicidation is required (see FIG. 2c). For example, a mask layer comprising a photoresist as an uppermost layer is formed over the entire configuration shown in FIG. 2b. Then, a pattern according to the region between the mask portions 90 (both the entire mask and the portions on areas And C are designated by the same reference sign for convenience) is defined in the photoresist and, after exposure, the material of the mask layer between portions 90 is removed. Subsequently, a cover layer 50 is formed on the mask portions 90 and the region between the mask portions 90, as shown in FIG. 2d.

Figure 2D:
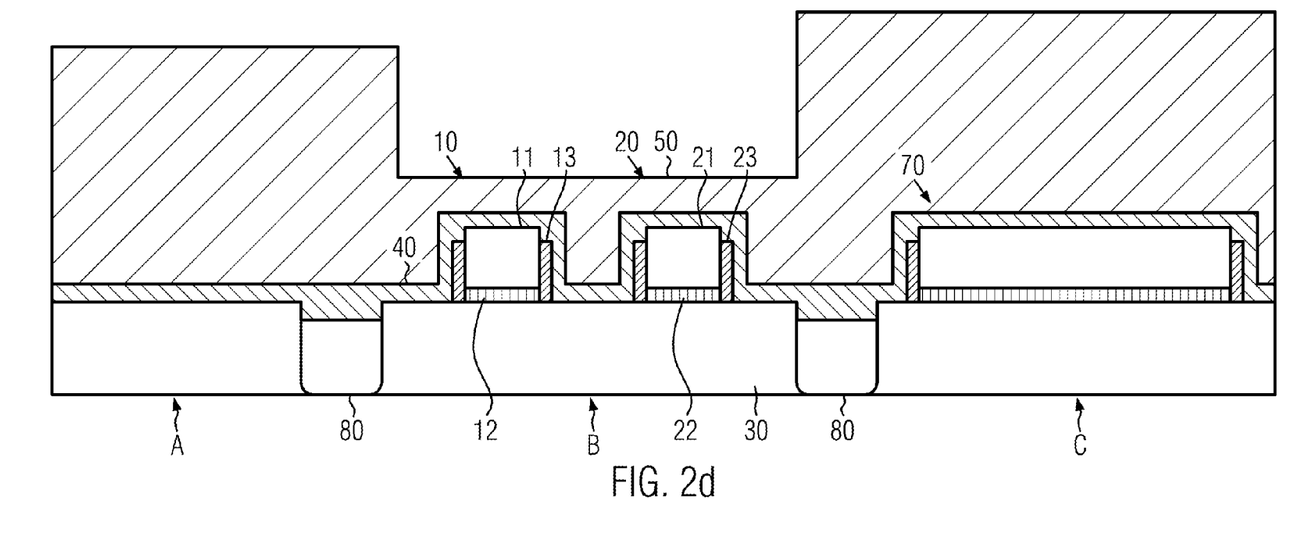
Figure 2E:
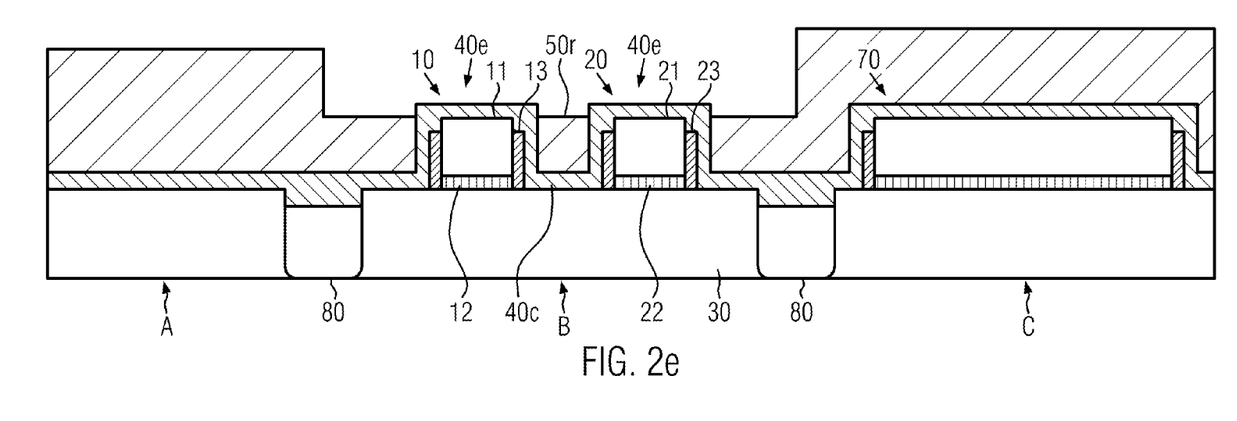

Next, the cover layer 50 is etched back to achieve the configuration shown in FIG. 2e. Both atop of transistor device 10 and transistor device 20, exposed portions 40e of the oxide layer 40 result from the back etching process. However, a portion 50r of the cover layer 50 remains between the gate electrodes 11 and 21 such that the portion 40e of the oxide layer 40 on the semiconductor substrate 30 between the gate electrodes 11 and 21 is still covered. The exposed portions

40e may, for example, have heights of between 1/10 to 1/2, particularly 1/5 to 1/3, of the heights of the gate electrodes.

In principle, one might think of achieving a configuration similar to the one shown in FIGS. 2d and 2e, respectively, by means of a mask layer covering regions A, B and C and representing a tri-layer stack comprising or consisting of (from top to bottom where the bottom is directed to the underlying oxide layer 40) a photoresist, an anti-reflective coating (ARC), for example, a silicon-containing ARC, and an OPL. Such tri-layer stacks are used for immersion lithography that became of importance with the approach of 45 nm technology. A pattern may be defined in the photoresist and after exposure the pattern is transferred to the ARC in order to expose the OPL in a region above the transistors 10 and 20. Subsequently, the pattern may be defined in the OPL by etching while maintaining some OPL above the gate electrodes 11 and 21. Further back etch, then, results in a configuration similar to the one shown in FIG. 2e. The back etch of the OPL, thus, has to be controlled such that there is some remaining portion 50r of the OPL between the gate electrodes 11 and 21.

Figure 2F:
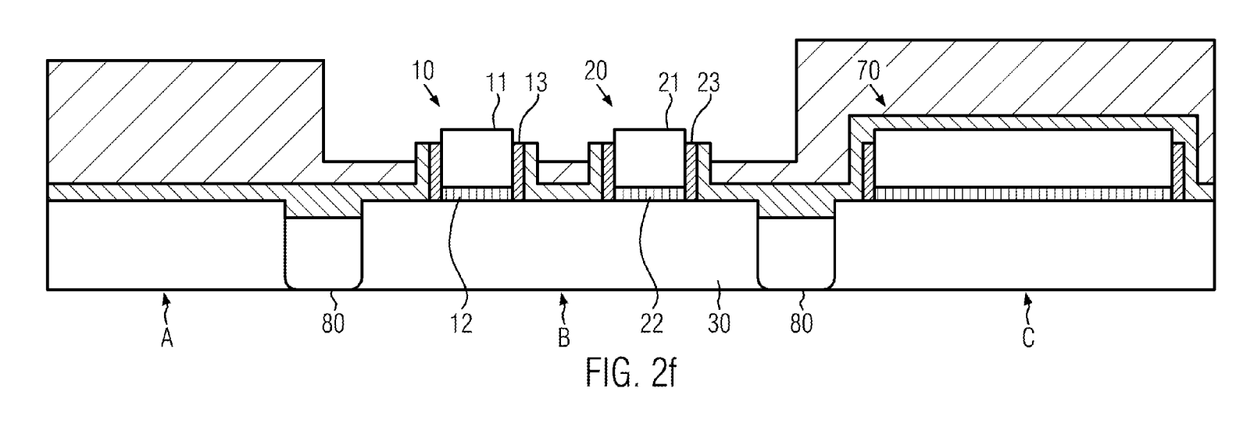
Figure 2G:
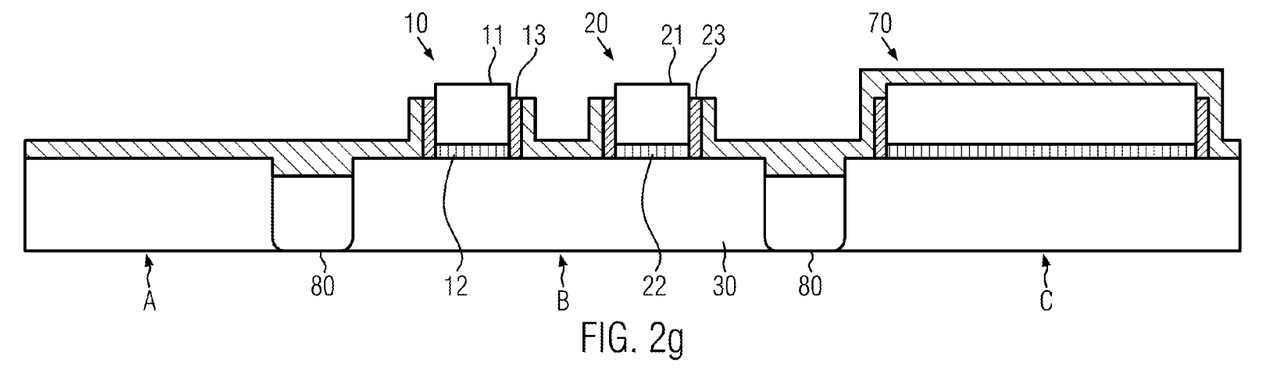
Figure 2H:
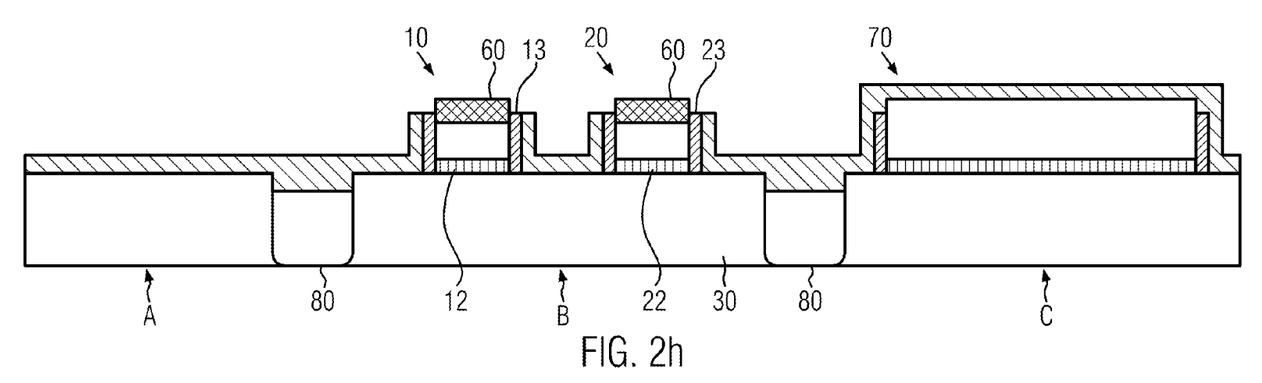

In any case, after change of the etching chemistry, the sacrificial oxide layer 40 is opened to expose the gate electrodes 11 and 21, as shown in FIG. 2f. FIG. 2g shows the manufacturing stage after removal of the remaining cover layer 50 and completion of an NiSi preclean step that might be performed with dHF and/or SiCoNi. Sufficient oxide is still present after NiSi precleaning in order to block subsequent silicidation of the semiconductor substrate 30 shown in FIG. 2h. Metal silicide regions 60 in the upper portions of the gate electrodes 11 and 21 may be formed on the basis of refractory metals, such as nickel, platinum and the like, that may be deposited and may be converted into a metal silicide by performing an appropriate heat treatment, for example, in the form of a rapid thermal anneal. Thereafter, any non-reacted metal material may be removed on the basis of well-established selective etch techniques, wherein additional heat treatments for stabilizing the overall characteristics may follow, if required. During the silicidation process, the spacer structures 13 and 23 may reliably cover the sidewalls of the gate electrodes 11 and 21, thereby avoiding significant metal "wraparound" so that enhanced controllability and uniformity of the silicidation process may be accomplished. Consequently, a desired thickness of the metal silicide regions 60 in the upper portions of the gate electrodes 11 and 21 may be obtained in a highly controllable manner.

Figure 2I:
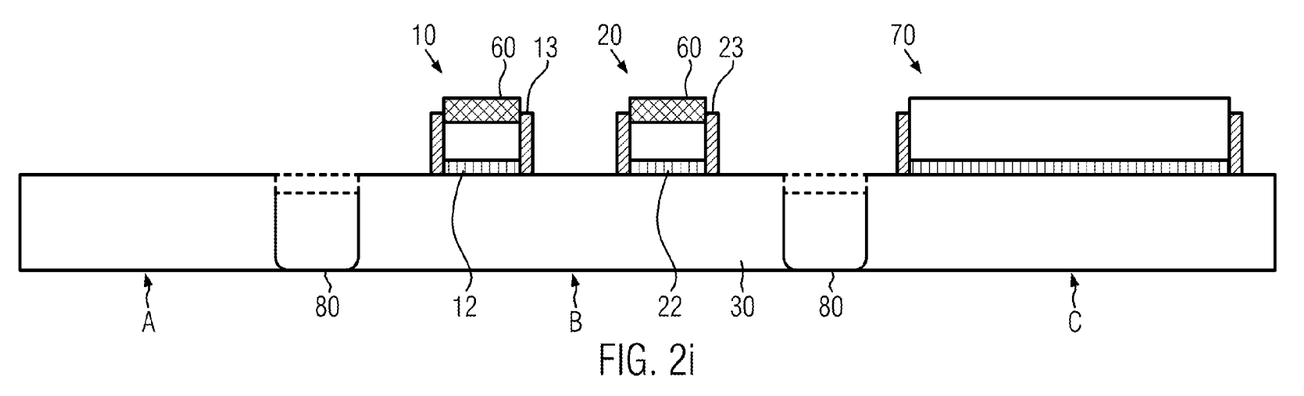

After completion of the final anneal process, the remaining sacrificial oxide 40 is removed and the configuration illustrated in FIG. 2i is achieved. Silicidation of the gate electrodes 11 and 21 of transistor devices 10 and 20 is obtained without any silicidation of the semiconductor substrate 30 whereupon the gate electrodes 11 and 21 are formed.

As a result, the present disclosure provides semiconductor devices comprising transistors and manufacturing techniques in which gate electrodes only show silicidation, whereas the semiconductor substrate on which the gate electrodes are formed remains free of any silicidation. This result is achieved by a combination of forming a mask and performing an OPL sequence that allows for a reliable silicidation of gate electrodes, particularly for small critical dimensions. The herein taught principles may be applied to the 45 nm, 35 nm as well as 22 nm technologies. Further modifications and variations of the present disclosure will be apparent to those skilled in the art in view of this description.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of performing silicidation of gate electrodes, comprising:
   (a) providing a semiconductor device comprising a semiconductor substrate with a defined active device area, a logic or SRAM area and a passive device area, wherein said active device area comprises two transistors, each comprising a gate electrode;
   (b) forming an oxide layer above said active device area, said logic or SRAM area and said passive device area, wherein said oxide layer covers said gate electrodes and said semiconductor substrate in said logic or SRAM area;
   (c) forming a mask layer above said oxide layer;
   (d) patterning said mask layer to define a patterned mask layer that covers said active device area and said passive device area and exposes portions of said oxide layer above said transistors and above said semiconductor substrate in said logic or SRAM area;
   (e) with said patterned mask layer in position, forming a cover layer above the exposed portions of said oxide layer above said transistors and above said semiconductor substrate in said logic or SRAM area;
   (f) etching said cover layer to expose portions of said oxide layer above said gate electrodes while maintaining a portion of said cover layer between said gate electrodes;
   (g) removing the exposed portions of said oxide layer from above said gate electrodes to expose upper portions of said gate electrodes while maintaining a portion of said oxide layer between said gate electrodes; and
   (h) performing silicidation of the exposed upper portions of said gate electrodes.

2. The method of claim 1, further comprising removing remaining portions of said cover layer before performing silicidation in step (h).

3. The method of claim 1, further comprising removing remaining portions of said oxide layer after performing silicidation in step (h).

4. A method of performing silicidation of gate electrodes, comprising:
   (a) providing a semiconductor device comprising a semiconductor substrate with a defined active device area, a logic or SRAM area and a passive device area, wherein said active device area comprises two transistors each comprising a gate electrode;
   (b) forming an oxide layer above said active device area, said logic or SRAM area and said passive device area, wherein said oxide layer covers said gate electrodes and said semiconductor substrate in said logic or SRAM area;
   (c) forming a mask layer above said oxide layer, said mask layer comprising a photoresist, an anti-reflective coating and an optical planarizing layer;
   (d) defining a pattern in said photoresist and exposing the patterned photoresist, wherein said pattern comprises an opening above said logic or SRAM area;
   (e) etching said anti-reflective coating based on said exposed patterned photoresist;

(f) etching said optical planarizing layer based on the etched anti-reflective coating such that portions of said oxide layer above said gate electrodes are exposed while maintaining a portion of said optical planarizing layer between said gate electrodes;

(g) removing the exposed portions of said oxide layer from above said gate electrodes to expose upper portions of said gate electrodes while maintaining a portion of said oxide layer between said gate electrodes; and (h) performing silicidation of the exposed upper portions of said gate electrodes.

5. The method of claim 4, further comprising removing remaining portions of said optical planarizing layer before performing silicidation in step (h).

6. The method of claim 4, further comprising removing remaining portions of said oxide layer after performing silicidation in step (h).

7. The method of claim 1, wherein said oxide layer is formed on said active device area, said logic or SRAM area and said passive device area.

8. The method of claim 7, wherein said mask layer is formed on and in contact with said oxide layer.

9. The method of claim 8, wherein said cover layer is formed on and in contact with the exposed portions of said oxide layer.

10. The method of claim 4, wherein said oxide layer is formed on said active device area, said logic or SRAM area and said passive device area.

11. The method of claim 10, wherein said mask layer is formed on and in contact with said oxide layer.

* * * * *